United States Patent [19]
Wasson

[11] Patent Number: 6,157,231
[45] Date of Patent: Dec. 5, 2000

[54] DELAY STABILIZATION SYSTEM FOR AN INTEGRATED CIRCUIT

[75] Inventor: Timothy M. Wasson, Portland, Oreg.

[73] Assignee: Credence System Corporation, Fremont, Calif.

[21] Appl. No.: 09/272,803

[22] Filed: Mar. 19, 1999

[51] Int. Cl.[7] .............................. H03K 5/13; H03L 7/06
[52] U.S. Cl. ........................................ 327/156; 158/161
[58] Field of Search .................................. 327/149, 150, 327/152, 153, 458, 159, 161–163, 262, 269, 270, 276, 277, 244, 245, 236, 535, 156

[56] References Cited

U.S. PATENT DOCUMENTS

| | | | |
|---|---|---|---|
| 4,789,976 | 12/1988 | Fujishima | 369/54 |
| 5,428,309 | 6/1995 | Yamauchi et al. | 327/156 |
| 5,561,692 | 10/1996 | Maitland et al. | 375/371 |
| 5,712,883 | 1/1998 | Miller et al. | 375/371 |
| 5,914,631 | 6/1999 | Soneda | 327/535 |
| 5,994,938 | 11/1999 | Lesmeister | 327/277 |

FOREIGN PATENT DOCUMENTS

| | | | |
|---|---|---|---|
| 63-69314 | 3/1988 | Japan | 327/277 |
| 63-69315 | 3/1988 | Japan | 327/277 |
| 4-213213 | 8/1992 | Japan | 327/277 |

*Primary Examiner*—Tuan T. Lam
*Attorney, Agent, or Firm*—Daniel J. Bedell; Smith-Hill and Bedell

[57] ABSTRACT

A system for stabilizing a delay through a signal path of an integrated circuit (IC) includes an oscillator for producing a periodic first reference signal, a delay circuit for delaying the first reference signal to produce a periodic second reference signal, and a loop controller for adjusting the magnitude of the IC's power supply so as to maintain a constant phase difference between the first and second reference signals. By adjusting the power supply magnitude, the loop controller also stabilizes signal path delays through logic circuits implemented in the IC. The oscillator is formed by a logic gate implemented in the IC and a passive delay line feeding the logic gate's output back to its input. The delay of the delay circuit is programmably adjustable to allow for adjustment of the signal path delay through the IC.

17 Claims, 2 Drawing Sheets

DELAY STABILIZATION SYSTEM FOR AN INTEGRATED CIRCUIT

BACKGROUND OF THE INVENTION

1. Field of the Invention

The present invention relates in general to feedback systems for adjusting the power supply input to an integrated circuit (IC) so as to stabilize signal delay through the IC and in particular to a system employing a delay circuit incorporated in the IC to sense IC signal delay.

2. Description of Related Art

The logic a programmable logic device (PLD) or a field programmable gate array (FPGA) carries out on its input signals to produce its output signal depends on how various logic blocks within the PLD or FPGA are interconnected to one another and to its input and output (I/O) terminals. We program a PLD or an FPGA by configuring its logic block interconnections. PLDs and FPGAs are frequently used instead of application specific integrated circuits (ASICs) to implement logic because an ASIC has to be specifically designed to carry out particular logic whereas a PLD or FPGA is an "off-the-shelf" component that can be easily programmed to carry out particular logic.

In many applications it is important for a logic circuit to provide a constant delay between an input signal and output signal. The delay of a signal path through an IC, whether it be an application specific integrated circuit (ASIC), a programmable logic device (PLD) or a field programmable gate array (FPGA) depends on the signal propagation delays through the transistors implementing logic gates forming the signal path. While physical characteristics of a transistor are a primary influence on its propagation delay, temperature also influences propagation delay, particularly in complementary metal oxide silicon (CMOS) transistors. A transistor's power supply voltage also influences its propagation delay. Therefore if we want an IC (particularly a CMOS IC) to provide a constant signal delay, we have to prevent variation in delay arising from changes in such factors as temperature and power supply voltage.

One approach to preventing changes in signal path delay of an IC arising from changes in power supply voltage or temperature is to keep the IC's power supply voltage and temperature at constant levels. It is a well-known technique to provide an IC with a well-regulated, substantially invariant power supply voltage. Controlling IC temperature is more problematic. Some delay stabilization systems sense the temperature of an IC and then increase or decrease the IC's temperature by turning on or off a heater as necessary to hold the sensed IC temperature within a desired range. There are many ways to sense the temperature of an IC, for example by using a temperature sensor attached to the IC or by sensing the temperature-dependent output of some electronic device implemented within the IC itself. Some systems employ an external heater attached to the IC, but external heaters waste much of the energy they produce and are difficult and expensive to thermally link to an IC. Other temperature stabilization systems include an internal heater formed by transistors implemented within the IC itself. Large heating transistors can generate substantial heat, but they can require a relatively large amount of space within the IC and can create a considerable amount of switching noise. Also since heat requires a certain amount of transit time, the loop delay in such a temperature stabilization system can make it difficult to accurately control temperature.

U.S. Pat. No. 4,789,976 issued Dec. 6, 1998 to Fujishima describes an integrated circuit implementing several delay circuits, each delaying an IC input signal to produce an IC output signal. Instead of trying to hold the temperature and power supply voltage of the IC constant, Fujishima's system adjusts the power supply voltage of the IC to compensate for any changes in delay through the delay circuits arising from changes in temperature. One of the delay circuits delays a stable reference clock signal generated by an external oscillator to produce an output indicating signal phase shifted from the reference clock signal by the amount of the delay provided by the reference delay circuit. A delay lock loop controller monitors the phase of the indicating signal in relation to the reference clock signal and adjusts the IC's power supply voltage so as to hold that phase relationship constant by holding the delay of the reference circuit constant. Since all delay circuits are of similar construction, are similar temperature, and receive the same power supply voltage, the loop controller holds the delay of all delay circuits constant.

Fujishima also describes another stabilization system in which inputs and outputs of a reference delay circuit implemented on an IC are interconnected to form a ring oscillator that oscillates with a period equal to the delay of the main delay circuit. A phase lock loop controller monitors the phase difference between the ring oscillator's output signal and an externally generated reference clock signal and adjusts the IC's supply voltage so as to phase lock the ring oscillator's output signal to the reference clock. This adjustment to the power supply voltage stabilizes the delay provided by the main delay circuit despite IC temperature changes.

While Fujishima's delay stabilization systems are effective, they require an input reference clock signal that has to have a highly stable and predictable period. In Fujishima's application such a reference clock signal is readily available as the carrier of one of the signals to be delayed. However in other applications where such a reference clock signal is not otherwise readily available, the delay stabilization system would have to include an oscillator such as a crystal oscillator which can be expensive. Also, the delay provided by Fujishima's system can't be easily adjusted to some desired level after the IC is fabricated. Thus while Fujishima's system is suitable for use in an ASIC where the desired signal delays are known at design time before the ASIC is fabricated, it may not be suitable for use in an PLD or an FPGA where desired signal delays are not known when the PLD or FPGA is fabricated.

What is needed is a delay stabilization system for an IC that does not require an external oscillator, that allows signal path delay through the IC to be accurately calibrated, and which can be easily used in connection with a conventional PLD or FPGA.

SUMMARY OF THE INVENTION

The present invention is an improved delay stabilization system for an integrated circuit (IC) which maintains a constant delay through logic circuits forming a signal path through the IC despite changes in IC temperature affecting the signal propagation speed of transistors forming those logic circuits. The system does this by adjusting the voltage of the power supply input to the IC to alter the signal propagation speed of the transistors to compensate for temperature-related changes.

The stabilization system includes a delay circuit incorporated into the IC formed by transistors similar to those forming the logic circuits so that they are similarly affected by IC temperature changes and IC power supply voltage.

The delay circuit delays a stable reference clock signal to produce a periodic output signal having the same frequency as the reference clock signal but shifted in phase by a desired portion of the period of the reference clock signal. A delay lock loop (DLL) controller monitors the phase difference between the reference clock signal and the delay circuit output signal and adjusts IC power supply voltage so as hold the phase shift provided by the delay circuit to the desired level despite IC temperature changes. By holding the phase shift provided by the delay circuit constant, the power supply voltage also holds the signal propagation speed of the transistors forming the delay circuit constant. Since the transistors forming the logic circuit and delay circuit are similar and are powered by the same supply voltage, then the power supply signal holds the signal propagation speed of the transistors forming the logic circuits constant despite changes in IC temperature. The system therefor stabilizes signal path delays though the IC's logic circuit.

In accordance with one aspect of the invention a passive delay line external to the IC and a logic gate internal to the IC are connected to form a ring oscillator for providing the reference clock signal input to the delay circuit. The reference clock signal period is proportional to the total path delay through the delay line and the inverter. The delay line path delay is independent of temperature and power supply voltage, and although the delay through the inverter varies with IC temperature and power supply, its influence on the period of the reference clock signal can be minimized by making the delay through the delay line much larger than the delay through the inverter. Thus the period of the reference clock produced by the ring oscillator is substantially constant and independent of IC temperature and power supply voltage. Therefore, while the delay stabilization system of the present invention requires a simple delay line connected between two IC terminals in order to obtain a stable reference clock signal, it does not require an expensive external oscillator to provide the reference clock signal.

In accordance with another aspect of the invention, the number of transistors forming the signal path through the delay circuit is programmably adjustable. While the DLL controller holds the signal path delay to a value proportional to the period of the reference clock signal, and while the ring oscillator provides a reference clock signal having a constant period, that period is not accurately predictable because it is based on the delay of the external delay line which is subject to process variation. By adjusting the programmable delay circuit, we adjust the ratio of proportionality between the reference clock signal period and the logic circuit signal path delay, thereby adjusting the signal path delay through the logic circuits. This adjustable delay calibration is particularly useful when the IC is a programmable logic device or field programmable gate array for which the desired logic circuit signal path delay is not known at the time the IC is designed and fabricated.

It is accordingly an object of the invention to provide an IC stabilization system for holding signal path delay through an IC constant despite changes in IC temperature.

It is another object of the invention to provide an IC stabilization system that allows the signal path delay to be accurately adjusted.

It is a further object of the invention to provide an accurate IC stabilization system that does not require a clock signal generated by an external oscillator.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form a delay stabilization system for an integrated circuit in accordance with the invention, FIG. 2 illustrates a suitable implementation of the programmable delay circuit of FIG. 1 in more detailed block diagram form, and FIG. 3 illustrates a delay stabilization system in accordance with an alternative embodiment of the invention.

DESCRIPTION OF THE PREFERRED EMBODIMENT(S)

Figure 1:
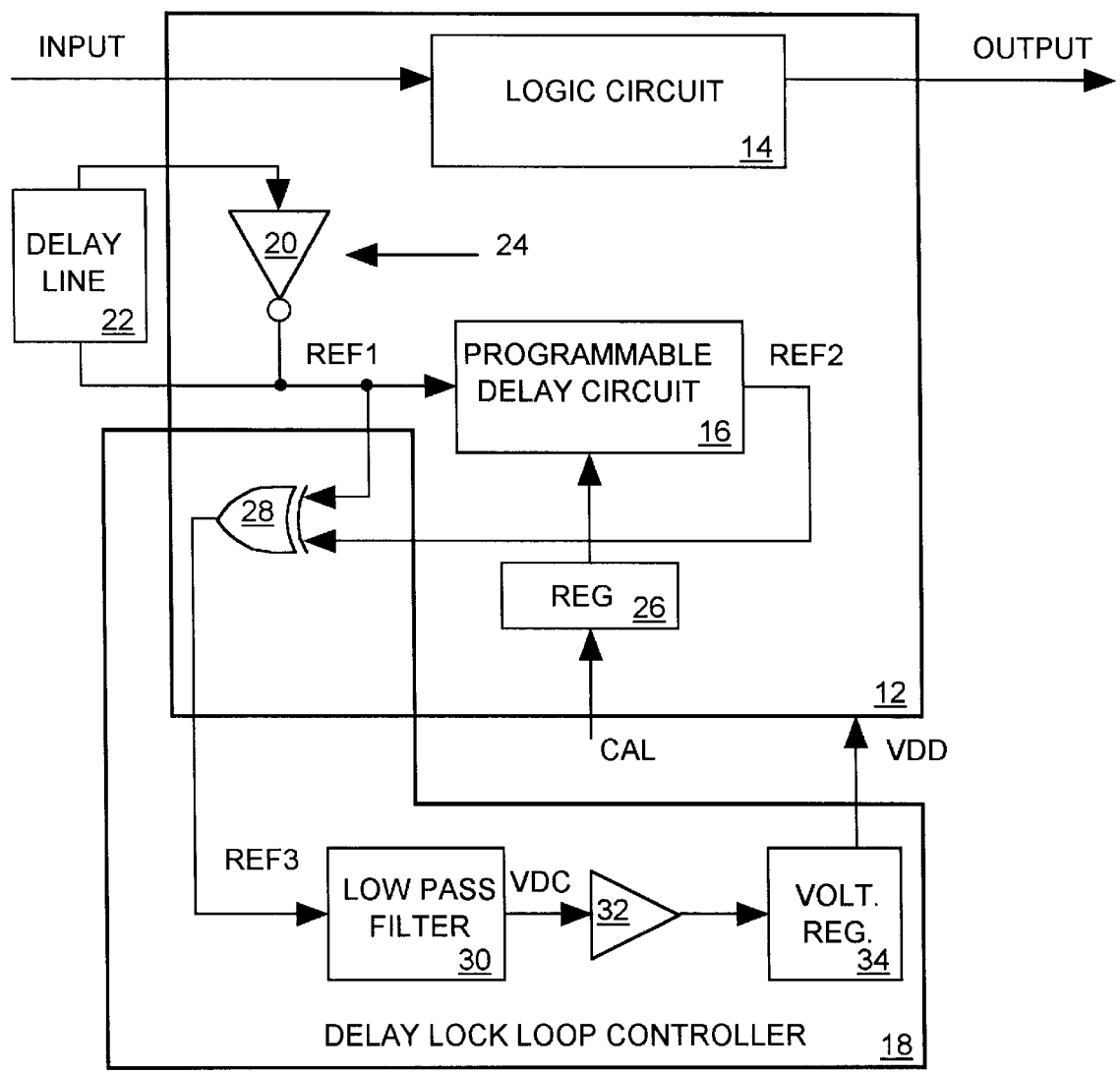

FIG. 1 illustrates in block diagram form an improved delay stabilization system 10 for an integrated circuit (IC) 12 in accordance with the present invention. Delay stabilization system 10 maintains a constant delay through a logic circuit 14 forming an IC signal path between IC input and output signals despite changes in IC temperature affecting the signal propagation speed of transistors forming that signal path. System 10 does this by controlling the power supply voltage input VDD to IC 12 so as to adjust the signal propagation speeds of the transistors therein to compensate for temperature-related changes in signal propagation speed. In particular, when increasing IC temperature causes signal propagation speeds to decline below a desired setpoint level, delay stabilization system 10 increases power supply voltage VDD to speed up the transistors within IC 12. Conversely, when decreasing IC temperature causes signal propagation speeds to increase above the setpoint level, delay stabilization system 10 decreases power supply voltage VDD to slow down transistors within IC 12. The setpoint level is determined by calibration data (CAL) supplied as input to IC 12.

Delay stabilization system 10 includes a programmable delay circuit 16 incorporated into IC 12 formed by transistors similar to those forming logic circuits 14. Thus IC temperature and power supply voltage VDD changes affect the signal propagation speed of transistors forming logic circuit 14 and delay circuit 16 in the same way. System 10 monitors the signal path delay through delay circuit 16 as a measure of the signal path delay through logic circuit 14 because the two delays are substantially proportional for all IC temperatures and for all power supply voltage levels.

Delay circuit 16 delays a stable reference clock signal REF1 to produce a periodic output signal REF2 having the same frequency as reference clock signal REF1 but shifted in phase by a desired portion of the period of reference clock signal REF1. A delay lock loop (DLL) controller 18 monitors the phase difference between reference clock signal REF1 and delay circuit output signal REF2 and adjusts IC power supply voltage VDD to hold the phase shift provided by delay circuit 16 to a constant proportion of the REF1 clock period despite IC temperature changes. By holding the phase shift provided by the delay circuit 16 constant, the VDD signal also stabilizes the signal propagation speed of the transistors forming delay circuit 16. Since the transistors forming logic circuits 14 are similar in construction to the transistors forming the delay circuit, are at similar temperatures and are powered from the same source VDD, then the signal propagation speed of the transistors forming logic circuit 14 are held constant despite changes in IC temperature. Thus system 10 stabilizes the delay though logic circuit 14.

Prior art systems employ an external source of reference clock signal REF1, typically a crystal oscillator having a period that is substantially independent of IC temperature and power supply voltage. However such crystal oscillators being implemented by discrete components are relatively expensive and require additional circuit board space. In accordance with one aspect of the invention, reference clock REF1 is provided by an inverter 20 included within IC 12 and having its input and output linked through a passive delay line 22 external to IC 12. Inverter 20 and delay line 22 form a ring oscillator 24 oscillating with a period equal to twice the total path delay through delay line 22 and inverter 20. The delay through passive delay line 22 is independent of IC temperature and power supply voltage VDD. Although the delay through inverter 20 varies with IC temperature and power supply voltage, its influence on the period of reference clock signal REF1 is minimized by making the delay through delay line 22 much larger than the path delay through inverter 20. Also the feedback provided by VDD helps to compensate for temperature-related changes in delay of inverter 20. Thus notwithstanding the small variation in REF1 due to temperature-sensitive delays through inverter 20, the period of reference clock REF1 is substantially constant and independent of IC temperature and power supply voltage. Those skilled in the art will appreciate that in some high frequency applications where the period of REF1 is very short, a suitable passive delay line 22 may be implemented wholly within IC 12 using inductors and capacitors formed by IC metalization layers using well-known techniques.

DLL controller 18 holds the signal path delay through logic circuit 14 to a value proportional to the period of stable reference clock signal REF1. However, while reference clock signal REF1 is stable, its period is not accurately predictable because the delay of external delay line 22 is determined by physical characteristics of the delay line that are subject to process variation. Also the ratio of proportionality between signal path delay through logic circuit 14 and the period of reference clock REF1, while stable, is not accurately predictable due to process variations in transistors forming logic circuit 14. To provide for accurate calibration of the delay through logic circuit 14, delay circuit 16 is made "programmable" insofar as calibration data (CAL) written into a register 26 controls the number of transistors forming the signal path through delay circuit 16. In doing so, the calibration data in register 26 controls the ratio of proportionality between the magnitude of supply voltage VDD and period of REF1. When we set the calibration data in register 26 to increase the number of transistors in the path through delay circuit 16, we decrease the supply voltage VDD level needed to hold delay circuit 16 to some particular delay, thereby increasing the delay through logic circuit 14. Conversely when we decrease the number of transistors in the path through delay circuit 16, we increase the supply voltage VDD level needed to hold delay circuit 16 to a particular delay, thereby decreasing the delay through logic circuit 14.

Delay Lock Loop Controller

DLL controller of FIG. 1 includes an exclusive (XOR) gate 28 receiving the REF1 and REF2 signal outputs of inverter 20 and delay circuit 16 and producing a periodic output signal REF3. A low pass filter 30 external to IC 12 filters REF3 to produce a direct current signal VDC. A power amplifier 32 and a voltage regulator 34 amplify and regulate VDC to produce the power supply signal VDD for IC 12. Since the duty cycle of the REF3 signal is a function of the phase difference between the REF1 and REF2 signals, when temperature changes in IC 12 change the delay through delay circuit 16, the duty cycle of REF3 changes. Since the voltage level of the output signal VDC of low pass filter 30 is proportional to the duty cycle of REF3, the voltage level of VDD rises or falls in proportion to changes in the duty cycle of REF3, and therefore in proportion to the delay through programmable delay circuit 16. Therefore when the delay through delay circuit 16 changes, the feedback path provided by DLL 18 changes VDD to compensate for that delay change. Note that XOR gate 28 may be internal IC 12 as shown in FIG. 1 or may be implemented external to IC 12.

Programmable Delay Circuit

Figure 2:
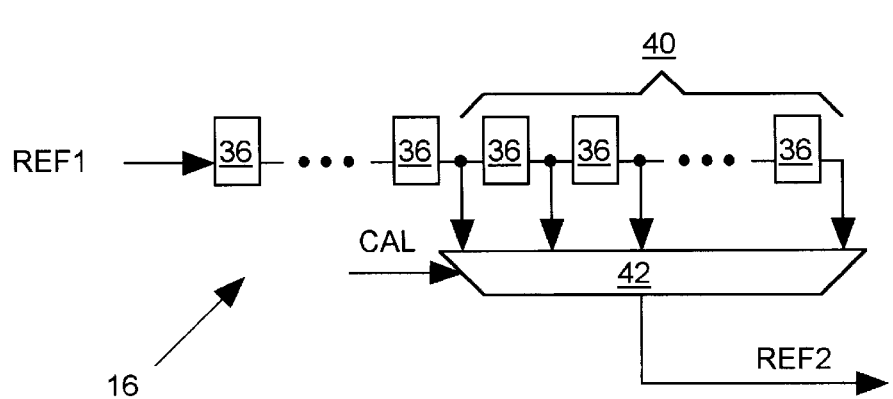

FIG. 2 illustrates a suitable implementation of programmable delay circuit 16 of FIG. 1 in more detailed block diagram form. Delay circuit 16 includes a set of delay elements 36 such as logic gates implemented by transistors having characteristics similar to transistors implementing logic circuit 14 of FIG. 1. Delay elements 36 are connected in series with reference clock signal REF1 passing though each element of the series in turn. A multiplexer 42 under control of the calibration data (CAL) stored in register 26 of FIG. 1 selects the output of one of a set 40 of delay elements 36 and provides its as the REF2 output of delay circuit 16. Thus the total delay between REF1 and REF2 is determined by adjustable number of delay elements in the signal path between REF1 and REF2. Note that as we decrease the delay and increase the number of delay elements 36, we increase the resolution with which its delay can be adjusted and therefore the resolution with we can control the delay through logic circuit 14 of FIG. 1. Although the total phase shift through delay circuit 16 should be adjustable over a range of one quarter of the period of the REF1 signal, the delay it provides may be much larger since delays of ¼, ⁵⁄₄, ⁹⁄₄ . . . (4N+1)/4 of the REF1 period all yield the same ¼ wavelength phase shift. Generally it is preferable to provide a long delay (i.e. many elements 36) in order to provide for a large the gain in the delay circuit's response to changes in VDD since this will improve the accuracy with which the stabilization system 10 of FIG. 1 controls signal path delays through logic circuit 14. However when the number of delay elements 36 in delay circuit 16 becomes too large, large swings in delay due to small temperature swings will destabilize the feedback loop.

Alternative Embodiment

Figure 3:
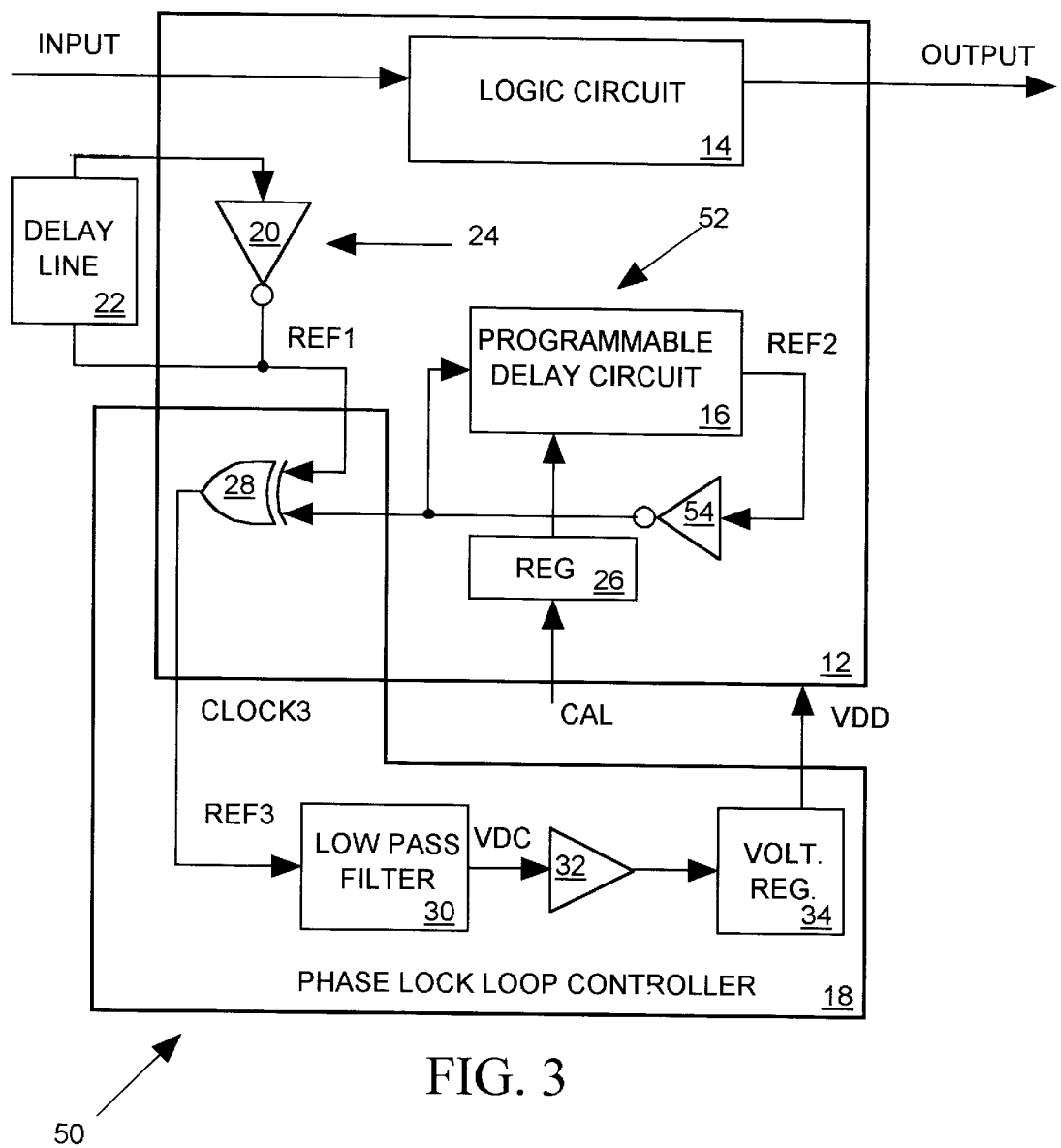

FIG. 3 illustrates a delay stabilization system 50 in accordance with an alternative embodiment of the invention that is generally similar to delay stabilization system 10 of FIG. 1. However in system 50 the REF1 signal is disconnected from the input of delay circuit 16 while the REF2 is fed back to the delay circuit input via an inverter 54. Programmable delay circuit 16 therefore acts as a ring oscillator 52 and loop controller 18 acts as a phase lock loop (PLL) controller to phase lock REF2 to REF1. Delay stabilization system 50 otherwise operate in a manner substantially similar to that of system 10 of FIG. 1 to adjustably control and stabilize the delay through logic circuit 14.

Use in PLDs and FPGAs

The logic a programmable logic device (PLD) or a field programmable gate array (FPGA) carries out on its input signals to produce its output signal depends on how various logic blocks within the PLD or FPGA are interconnected to one another and to its input and output (I/O) terminals. We program a PLD or an FPGA by configuring its logic block interconnections. PLDs and FPGAs are frequently used instead of application specific integrated circuits (ASICs) to implement logic because an ASIC has to be specifically designed to carry out particular logic whereas a PLD or FPGA is an "off-the-shelf" component that can be easily programmed to carry out particular logic.

The delay stabilization systems 10 of FIG. 1 and 50 of FIG. 3 are particularly suited for implementation in PLDs and FPGAs in which a portion of their logic blocks can be configured to implement delay circuit 16, inverter 20, register 26 and XOR gate 28. In the case of an FPGA, the delay circuit doesn't have to be controlled by calibration data (CAL) stored in register 26 (CAL) because the number of delay elements in delay circuit 16 can be adjusted by changing the data that programs the FPGA. In such case a separate register 16 for holding calibration data would not be necessary.

Thus have been described preferred embodiments of a delay stabilization circuit for an integrated circuit in accordance with the present invention. The circuit accurately and adjustably controls the signal path delay through an integrated circuit without requiring an input from an external oscillator and without employing heaters to control IC temperature. While the forgoing specification has described preferred embodiments of the present invention, one skilled in the art may make many modifications to the preferred embodiments without departing from the invention in its broader aspects. The appended claims therefore are intended to cover all such modifications as fall within the true scope and spirit of the invention.

What is claimed is:

1. A system for stabilizing a delay through a signal path of an integrated circuit (IC), wherein said signal path is formed by first transistors, wherein said delay depends on signal propagation speed of said first transistors which is in turn influenced by a temperature of said IC and by a magnitude of a power supply signal applied to said IC, the system comprising:
    an oscillator for producing a periodic first reference signal, said oscillator comprising gate means internal to said IC having an input and an output and delay means external to said IC for connecting said input to said output,
    a delay circuit for delaying said first reference signal to produce a periodic second reference signal, and
    controller means for receiving said first and second reference signals and for controlling said magnitude of said power supply signal so as to maintain a constant phase difference between said first and second reference signals.

2. The system in accordance with claim 1 wherein said delay means is a passive delay line.

3. The system in accordance with claim 1 wherein a delay provided by said delay means is substantially independent of a temperature of said IC and of said magnitude of said power supply signal.

4. The system in accordance with claim 3 wherein a delay provided by said delay means is substantially larger than a signal path delay though said gate means.

5. The system in accordance with claim 3 wherein a signal path through said delay circuit is formed by a plurality of second transistors, wherein a phase difference between said first and second reference signals is a function of said magnitude of said power supply signal applied to said IC.

6. The system in accordance with claim 5 further comprising adjusting means for selectively adjusting a number of said second transistors in said signal path through said delay circuit.

7. The system in accordance with claim 6 wherein said adjusting means includes means for receiving and storing input data for controlling said number of second transistors included in said signal path through said delay circuit.

8. The system in accordance with claim 1 where said IC is a programmable logic device.

9. The system in accordance with claim 1 where said IC is a field programmable gate array (FPGA) including a plurality of logic blocks including said first transistors and interconnected to one another to form said signal path and said delay circuit in a manner controlled by input data.

10. The system in accordance with claim 1 wherein said controller means comprises a delay lock loop controller.

11. The system in accordance with claim 1 wherein said first and second reference signals have a 50% duty cycle.

12. A system for stabilizing a delay through a signal path of an integrated circuit (IC), wherein said signal path is formed by first transistors, wherein said delay depends on signal propagation speed of said first transistors which is in turn influenced by a magnitude of a power supply signal applied to said IC, the system comprising:
    a first oscillator for producing a periodic first reference signal, wherein a period of said first reference signal is substantially independent of a temperature of said IC and of the magnitude of said power supply signal,
    a second ring oscillator implemented on said IC for producing a periodic second reference signal, wherein a period of said second reference signal is a function of the temperature of said IC and the magnitude of said power supply signal; and
    controller means for receiving said first and second reference signals and for controlling the magnitude of said power supply signal so as to maintain a constant phase difference between said first and second reference signals,
    wherein said first oscillator comprises gate means internal to said IC having an input and an output and delay means external to said IC for connecting said input to said output.

13. The system in accordance with claim 12 wherein said delay means is a passive delay line.

14. The system in accordance with claim 12 wherein said second ring oscillator is formed by a plurality of second transistors, wherein a period of said second reference signal is a function of said magnitude of said power supply signal applied to said IC, and of a number of second transistors forming said second ring oscillator.

15. The system in accordance with claim 14 further comprising means for selectively adjusting the number of said second transistors forming said second ring oscillator.

16. The system in accordance with claim 12 where said IC is a programmable logic device.

17. The system in accordance with claim 12 where said IC is a field programmable gate array.

* * * * *